(12) United States Patent
Rhee et al.

(10) Patent No.: US 7,301,381 B2
(45) Date of Patent: Nov. 27, 2007

(54) CLOCKED STATE DEVICES INCLUDING MASTER-SLAVE TERMINAL TRANSMISSION GATES AND METHODS OF OPERATING SAME

(75) Inventors: Young-chul Rhee, Gyeonggi-do (KR); Sung-we Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 51 days.

(21) Appl. No.: 11/194,272

(22) Filed: Aug. 1, 2005

(65) Prior Publication Data

US 2006/0103443 A1    May 18, 2006

(30) Foreign Application Priority Data

Nov. 17, 2004  (KR)  ............... 10-2004-0094176

(51) Int. Cl.
*H03K 3/289* (2006.01)
(52) U.S. Cl. .............. 327/203; 327/201; 327/211; 327/212; 327/218
(58) Field of Classification Search .............. None
See application file for complete search history.

(56) References Cited

U.S. PATENT DOCUMENTS

| | | | | |
|---|---|---|---|---|
| 3,697,775 A | * | 10/1972 | Kane | 326/57 |
| 5,317,205 A | * | 5/1994 | Sato | 326/21 |
| 5,656,962 A | * | 8/1997 | Banik | 327/202 |
| 5,767,716 A | * | 6/1998 | Ko | 327/203 |
| 6,002,284 A | * | 12/1999 | Hill et al. | 327/202 |
| 6,204,707 B1 | * | 3/2001 | Hamada et al. | 327/202 |
| 6,677,795 B2 | * | 1/2004 | Itoh | 327/202 |
| 6,803,799 B1 | * | 10/2004 | Churchill et al. | 327/202 |
| 6,864,733 B2 | * | 3/2005 | Anshumali et al. | 327/210 |
| 6,975,152 B1 | * | 12/2005 | Lapidus | 327/202 |
| 7,129,762 B1 | * | 10/2006 | Vadi | 327/218 |
| 2004/0051574 A1 | * | 3/2004 | Ko et al. | 327/218 |

FOREIGN PATENT DOCUMENTS

| | | |
|---|---|---|
| JP | 11-330917 | 11/1999 |
| KR | 2004-017948 | 3/2004 |

* cited by examiner

*Primary Examiner*—Tuan T. Lam
*Assistant Examiner*—William Hernandez
(74) *Attorney, Agent, or Firm*—Myers, Bigel, Sibley & Sajovec, P.A.

(57) ABSTRACT

A clocked state circuit can include a transmission gate configured to clock an output of a master terminal to an input of a slave terminal responsive to a clock signal or a delayed clock signal coupled to the transmission gate.

10 Claims, 5 Drawing Sheets

CLOCKED STATE DEVICES INCLUDING MASTER-SLAVE TERMINAL TRANSMISSION GATES AND METHODS OF OPERATING SAME

CROSS-REFERENCE TO RELATED APPLICATION

This application claims the priority of Korean Patent Application No. 10-2004-0094176, filed on Nov. 17, 2004, in the Korean Intellectual Property Office, the disclosure of which is incorporated herein in its entirety by reference.

FIELD OF THE INVENTION

The present invention relates to integrated circuits, and more particularly, to clocked state devices and methods of operating the same.

BACKGROUND

A flip-flop is a general data storage device used in a digital electronic circuit. The flip-flop can be a significant factor in designing a digital electronic circuit, since it is a clocked storage (or state) element used to design sequential and stable logic. The flip-flop can be used to store logic states, parameters, or digital control signals.

To realize a high-performance microprocessor, the flip-flop may be manufactured to operate at maximum logic clocking speed while reducing flip-flop setup/hold time and clock-to-output time. In addition, the flip-flops should have a short data response time while reducing data-to-clock time.

FIG. 1 is a circuit diagram of a conventional flip-flop 100. The flip-flop 100 includes a master terminal 110 and a slave terminal 120 that use tri-state buffers as switching elements. The master terminal 110 includes a first inverter 111 that receives a clock signal CK and outputs an inverted clock signal CKB, a second inverter 112 that receives the inverted clock signal CKB and outputs an internal clock signal CKI, a first tri-state buffer 113 that receives input data D in response to the internal clock signal CKI and the inverted clock signal CKB, and a first latch 114 that latches an output of the first tri-state buffer 113. The first latch 114 includes a third inverter 115 that receives the output of the first tri-state buffer 113, and a second tri-state buffer 116 that receives an output of the third inverter 115 and feeds back the received output to the third inverter 115 in response to the inverted clock signal CKB and the internal clock signal CKI.

The slave terminal 120 includes a third tri-state buffer 121 that receives an output of the first latch 114 in response to the inverted clock signal CKB and the internal clock signal CKI, a second latch 122 that latches an output of the third tri-state buffer 121, and a fourth inverter 123 that receives the output of the third tri-state buffer 121 and outputs an output signal Q. The second latch 122 includes a fifth inverter 124 that receives the output of the third tri-state buffer 121, and a fourth tri-state buffer 125 that receives an output of the fifth inverter 124 and feeds back the received output to the fifth inverter 124 to latch the output in response to the internal clock signal CKI and the inverted clock signal CKB.

FIG. 2 is a circuit diagram of a tri-state buffer, such as the tri-state buffers 113, 116, 121, and 125. Referring to FIG. 2, the tri-state buffer generates an output signal Y by inverting an input signal A in response to a first enable signal CKP and a second enable signal CKN. The tri-state buffer includes first and second PMOS transistors 201 and 202 and first and second NMOS transistors 203 and 204, which are connected in series between a supply voltage VDD and a ground voltage VSS. The input signal A is input to the gates of the first PMOS transistor 201 and the second NMOS transistor 204, the first enable signal CKP is input to the gate of the second PMOS transistor 202, and the second enable signal CKN is input to the gate of the first NMOS transistor 203. The logic levels of first enable signal CKP and the second enable signal CKN are different from each other (i.e., out of phase with one another), like the inverted clock signal CKB and the internal clock signal CKI illustrated in FIG. 1.

The flip-flop 100 stores the input data D in the master terminal 110 in response to the clock signal CK that goes to logic low, and outputs the data D stored in the master terminal 110 as the output signal Q to be output from the slave terminal 120 in response to the clock signal CK that goes to logic high. In this case, the tri-state buffers 113, 116, 121, and 125 of the flip-flop 100 are selectively enabled in response to the inverted clock signal CKB and the internal clock signal CKI. When the clock signal CK is input to the master terminal 110, the inverted clock signal CKB and the internal clock signal CKI are output from the first and second inverters 111 and 112, respectively. Accordingly, a delay in the operations of the first and second inverters 111 and 112 results can provide a delay in generation of the inverted clock signal CKB and the internal clock signal CKI. A delay in the generation of the inverted cock signal CKB and the internal clock signal CKI may reduce the operating speed of the flip-flop 100, which may affect the operating speed of the flip-flop 100.

SUMMARY

Embodiments according to the invention can provide clocked state devices including master-slave terminal transmission gate and methods of operating the same. Pursuant to these embodiments, a clocked state circuit can include a transmission gate configured to clock an output of a master terminal to an input of a slave terminal responsive to a clock signal or a delayed clock signal coupled to the transmission gate. In some embodiments according to the invention, the circuit further includes a first inverter circuit including an input coupled to an external clock and an output to provide the clock signal. A second inverter circuit includes an input coupled to the clock signal and an output to provide the delayed clock signal.

In some embodiments according to the invention, the transmission gate is further configured to transmit the output of the master terminal to the input of the slave terminal responsive a logical OR function of a first state of the clock signal and a second state of the delayed clock signal, wherein the second state is opposite the first state. In some embodiments according to the invention, the transmission gate includes a first pass transistor configured to transmit the output of the master terminal to the input of the slave terminal responsive to a first state of the clock signal. A second pass transistor is configured to transmit the output of the master terminal to the input of the slave terminal responsive to a second state of the delayed clock signal, wherein the second state is opposite the first state. In some embodiments according to the invention, the first pass transistor is an NMOS transistor and the second pass transistor is a PMOS transistor.

In some embodiments according to the invention, the circuit further includes an output pre-driving circuit including an input coupled to the output of the master terminal and an output coupled to an output of the slave terminal, wherein the output pre-driving circuit is configured to drive data provided at the output of the master terminal to the an output of the slave terminal responsive to a state of the clock signal.

In some embodiments according to the invention, the output pre-driving circuit includes a data output gate including an input coupled to the output of the master terminal and an output coupled to the output of the slave terminal. A pull-up gate is coupled to the data output gate and configured to pull up the output of the data output gate responsive to a state of the clock signal.

In some embodiments according to the invention, the master terminal further includes a tri-state inverter circuit coupled to a data input of the clocked state circuit configured to provide inverted data. A latch circuit is coupled to the inverted data and configured to latch the inverted data to provide latched inverted data to the transmission gate.

In some embodiments according to the invention, the latch circuit is a first latch circuit and the slave terminal further includes a second latch circuit coupled to the transmission gate and configured to latch the output therefrom. An inverter circuit is coupled to the transmission gate and configured to provide output data to an output of the clocked state circuit.

In some embodiments according to the invention, the circuit further includes an output pre-driving circuit including an input coupled to the output of the master terminal and an output coupled to an output of the slave terminal, wherein the output pre-driving circuit is configured to drive data provided at the output of the master terminal to the an output of the slave terminal responsive to a state of the clock signal.

In some embodiments according to the invention, a method of operating a clocked state circuit includes clocking an output of a master terminal to an input of a slave terminal responsive to a clock signal or a delayed clock signal coupled to a transmission gate therebetween.

In some embodiments according to the invention, the method further includes inverting an external clock to provide the clock signal and inverting the clock signal to provide the delayed clock signal. In some embodiments according to the invention, the method further includes transmitting the output of the master terminal to the input of the slave terminal responsive a logical OR function of a first state of the clock signal and a second state of the delayed clock signal, wherein the second state is opposite the first state.

In some embodiments according to the invention, transmitting includes transmitting the output of the master terminal to the input of the slave terminal responsive to a first state of the clock signal. The output of the master terminal is transmitted to the input of the slave terminal responsive to a second state of the delayed clock signal, wherein the second state is opposite the first state.

DESCRIPTION OF EMBODIMENTS ACCORDING TO THE INVENTION

Figure 1:
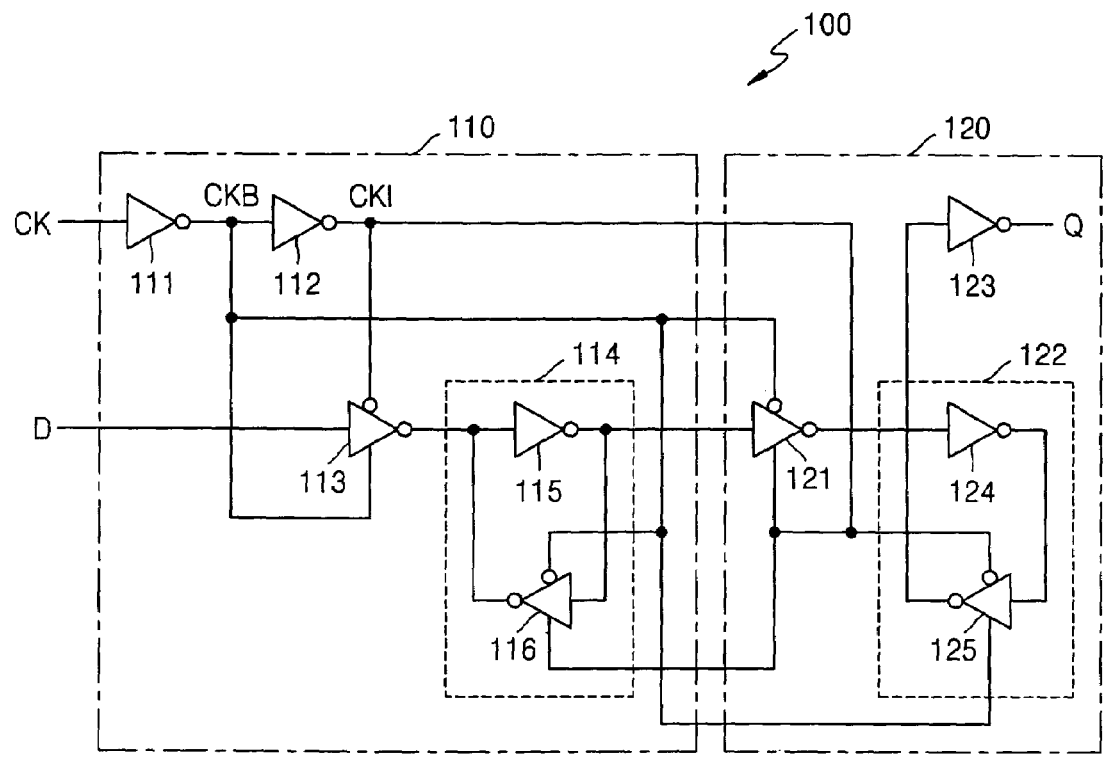
FIG. 1 is a circuit diagram of a conventional flip-flop.
Figure 2:
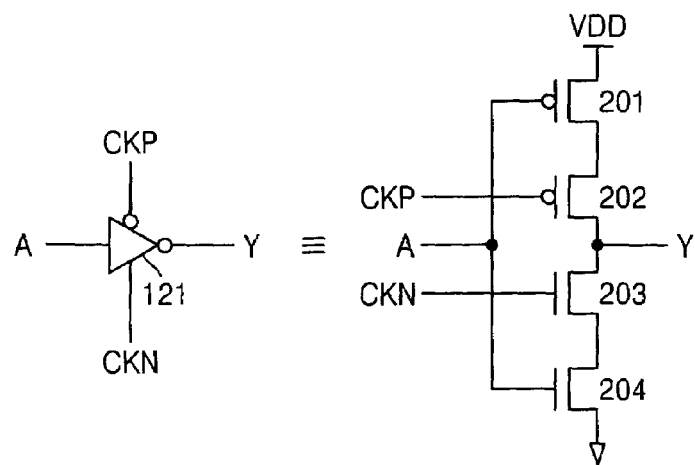
FIG. 2 is a circuit diagram of a conventional tri-state buffer.

The invention is described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
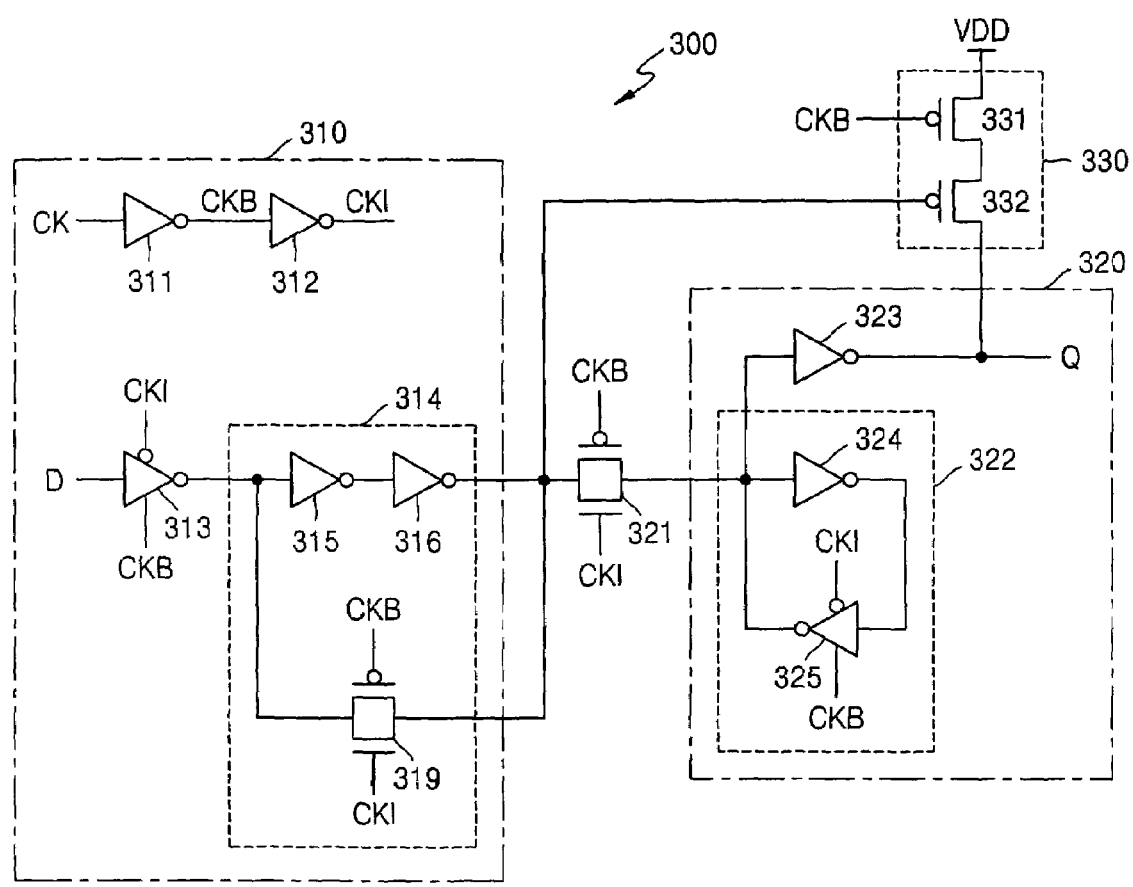
FIG. 3 is a circuit diagram of a flip-flop according to some embodiments of the present invention.

FIG. 3 is a circuit diagram of a flip-flop 300 according to some embodiments of the present invention. In some embodiments according to the invention, the flip-flop 300 includes a master terminal 310 and a slave terminal 320 that use transmission gates as switching elements, and an output pre-driving unit (or circuit) 330. The master terminal 310 includes a first inverter (circuit) 311 that receives a clock signal CK and outputs an inverted clock signal CKB, a second inverter 312 that receives the inverted clock signal CKB and outputs an internal clock signal CKI, a first tri-state buffer 313 that receives input data D in response to the internal clock signal CKI and the inverted clock signal CKB, and a first latch 314 that latches an output of the first tri-state buffer 313. The first latch 314 includes a third inverter 315 that receives the output of the first tri-state buffer 313, a fourth buffer 316 that receives an output of the third inverter 315, and a first transmission gate 319 that transmits an output of the fourth buffer 316 to the third inverter 315 in response to the inverted clock signal CKB and the internal clock signal CKI.

In some embodiments according to the invention, the slave terminal 320 includes a second transmission gate 321 that transmits an output of the first latch 314 in response to the inverted clock signal CKB and the internal clock signal CKI, a second latch 322 that latches an output of the second transmission gate 321, and a fifth inverter 323 that receives an output of the second transmission gate 321 and outputs an output signal Q. The second latch 322 includes a sixth inverter 324 that receives the output of the second transmission gate 321, and a second tri-state buffer 325 that receives an output of the sixth inverter 324 and feeds back the received output to the sixth inverter 324 in response to the internal clock signal CKI and the inverted clock signal CKB.

The output pre-driving unit 330 includes first and second PMOS transistors 331 and 332 connected in series between a supply voltage VDD and the output signal Q. The inverted clock signal CKB is input to the gate of the first PMOS transistor 331, and the output of the first latch 314 is input to the gate of the second PMOS transistor 332.

In some embodiments according to the invention, the input data D is output to the first latch 314 using the master terminal 310 operating in response to the clock signal that goes to logic low, and then, an output of the first latch 314 is output as the output signal Q using the slave terminal 320 operating in response to the clock signal CK that goes to logic high or the output signal Q is driven using the output pre-driving unit 330.

In some embodiments according to the invention, when the input data D is at a logic high level, the inverted clock signal CKB and the internal clock signal CKI generated by the master terminal 310 in response to the clock signal CK that goes to logic low are at a logic high level and a logic low level, respectively. Thus, both the outputs of the first tri-state buffer 313 and the first latch 314 are at a logic low level. Next, the inverted clock signal CKB goes to logic low and the internal clock signal CKI goes to logic high, in response to the clock signal CK at a logic high level. In the output pre-driving unit 330, the first PMOS transistor 331 is turned on in response to the inverted clocks signal CKB at a logic low level, the second PMOS transistor 332 is turned on in response to the output of the first latch 314 at a logic low level, and the output signal Q is output at a logic high level equal to the supply voltage VDD. In this case, in the slave terminal 320, when the second transmission gate 321 is turned on, the output of the first latch 314 that goes logic low is input to the fifth inverter 323 and output, as the output signal Q that goes logic high, from the fifth inverter 323. In other words, in some embodiments according to the invention, the flip-fop 300 receives the input data D at a logic high level and outputs the output signal Q at a logic high level.

In some embodiments according to the invention, when the input data D is at a logic low level, both the outputs of the first tri-state buffer 313 and the first latch 314 are generated at a logic high level in response to the inverted clock signal CKB at a logic high level and the internal clock signal CKI at a logic low level. Next, the inverted clock signal CKB is at a logic low level and an the internal clock signal CKI is at a logic high level in response to the clock signal that goes to logic high. In this case, the second transmission gate 321 of the slave terminal 320 is turned on, and the output of the first latch 314 that goes to logic high is input to the fifth inverter 323 and output, as the output signal Q that goes to logic low, from the fifth inverter 323. In this case, in the output pre-driving unit 330, the second PMOS 332 is turned off in response to the output of the first latch 314 at a logic high level, and thus, supply of the supply voltage VDD is discontinued. That is, the flip-flop 300 receives the input data D at a logic low level and outputs the output signal Q at a logic low level.

In some embodiments according to the invention, the flip-flop 300 receives the input data D and generates the output signal Q in response to the inverted clock signal CKB obtained by inverting the clock signal CK using the first inverter 311. Thus, in some embodiments according to the invention, it is possible to reduce a delay in the operation of the flip-flop 300 as compared to when generating the inverted clock signal CKB and the internal clock signal CKI using the two inverters 111 and 112 of FIG. 1. Accordingly, the flip-flop 300 may operate faster than the conventional flip-flop 100 of FIG. 1.

Figure 4:
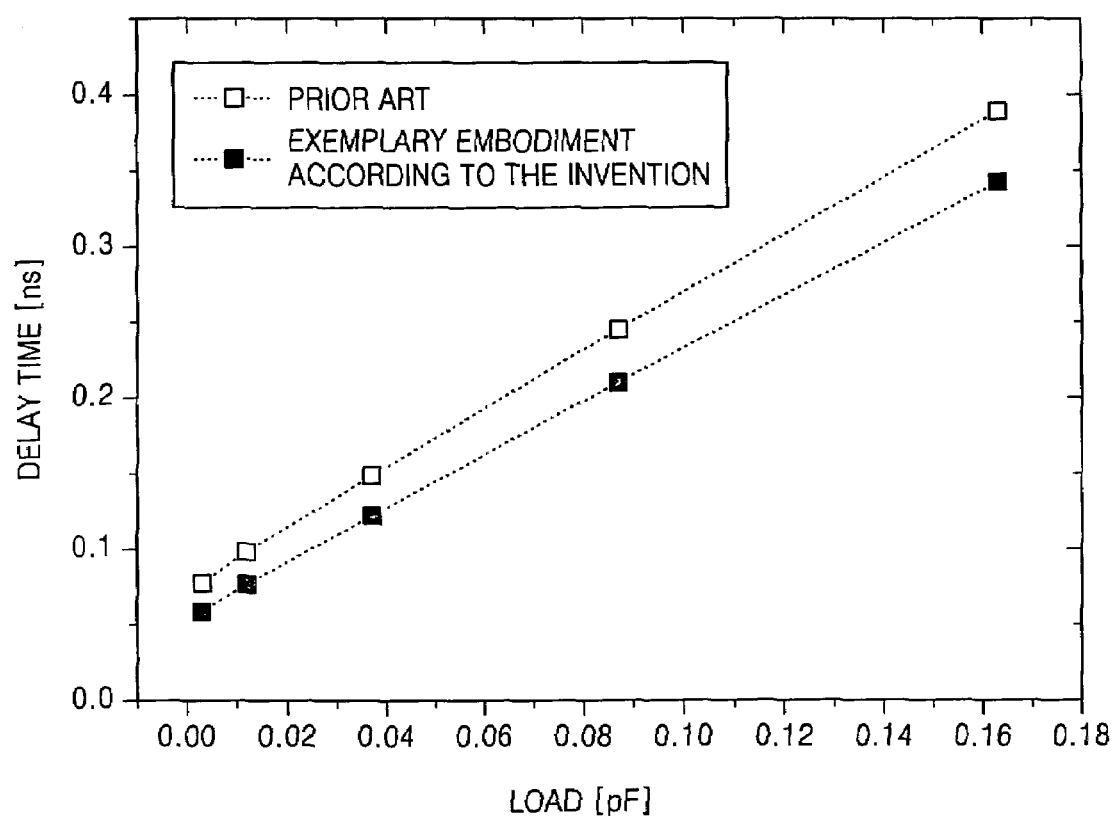
FIG. 4 is a graph comparatively illustrating delays in operations of a flip-flop according to an exemplary embodiment the present invention and a conventional flip-flop.
Figure 5:
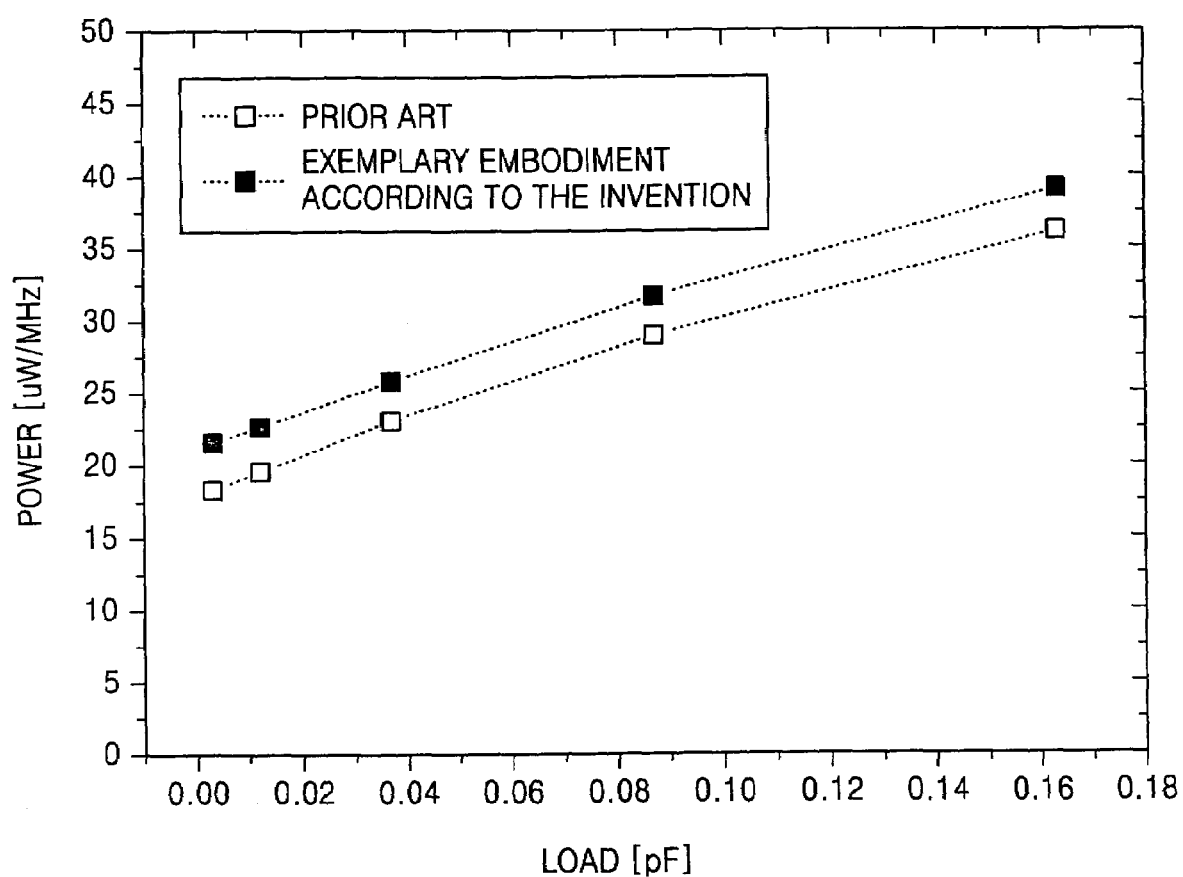
FIG. 5 is a graph comparatively illustrating power consumed by a flip-flop according to an exemplary embodiment of the present invention and a conventional flip-flop.
Figure 6:
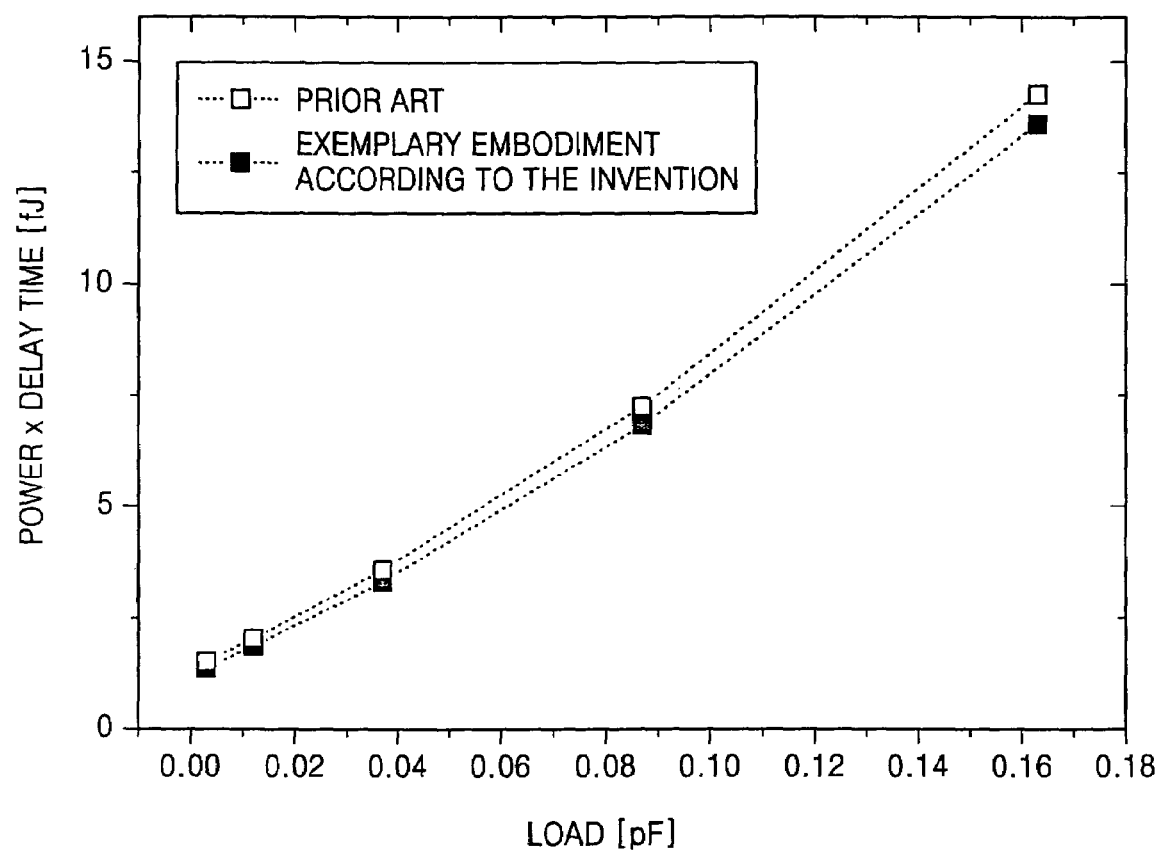
FIG. 6 is a graph illustrating the multiplication characteristics of delays and power consumption of a flip-flop in some embodiments according to the present invention.

FIGS. 4 through 6 are graphs comparing exemplary performance of a flip-flop 300 according to an embodiment of the invention and the conventional flip-flop 100. Specifically, FIG. 4 is a graph illustrating delays in the operation of a flip-flop 300 and the operation of the conventional flip-flop 100. Referring to FIG. 5, a delay in the operation of the flip-flop 300 was reduced by 12 to 23% compared to that in the operation of the conventional flip-flop 100. FIG. 5 is a graph illustrating the amounts of power consumed by the flip-flop 300 and the conventional flip-flop 100. Referring to FIG. 5, the amount of power consumed by the flip-flop 300 was lower by 8 to 17% than that of power consumed by the conventional flip-flop 100. FIG. 6 is a graph comparing the multiplication characteristics of delay and power consumption of the flip-flop 300 with those of delay and power consumption of the conventional flip-flop 100. Referring to FIG. 6, the result of multiplication of the flip-flop 300 was higher by 5 to 10% than that of multiplication of the conventional flip-flop 100.

Although the present invention has been described with reference to the embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed:

1. A high-speed flip-flop comprising:
   a master terminal receiving input data in response to an inverted clock signal and an internal clock signal, the inverted clock signal being generated by inverting a clock signal;
   a slave terminal receiving an output of the master terminal and outputting the received output as an output signal in response to the inverted clock signal and the internal clock signal; and
   an output pre-driving unit driving the output signal in response to the inverted clock signal and an output of the master terminal, wherein the master terminal comprises:
   a first inverter receiving a clock signal and outputting the inverted clock signal;
   a second inverter receiving the inverted clock signal and outputting the internal clock signal;
   a first tri-state buffer receiving the input data in response to the internal clock signal and the inverted clock signal; and a first latch latching an output of the first tri-state buffer wherein the output pre-driving unit comprises:

a first PMOS transistor having a source to which a supply voltage is applied, and a gate to which the inverted clock signal is input; and a second PMOS transistor having a source connected to a drain of the first PMOS transistor, a drain to which the output signal is input, and a gate to which the output of the master terminal is input.

2. The high-speed flip-flop of claim 1, wherein the first latch comprises:

a third inverter receiving the output of the first tri-state buffer;

a fourth inverter receiving an output of the third inverter; and a first transmission gate transmitting an output of the fourth inverter to the third inverter in response to the inverted clock signal and the internal clock signal.

3. The high-speed flip-flop of claim 1, wherein the slave terminal comprises:

a second transmission gate transmitting an output of the master terminal in response to the inverted clock signal and the internal clock signal;

a second latch latching an output of the second transmission gate; and a fifth inverter receiving the output of the second transmission gate and outputting the output signal.

4. The high-speed flip-flop of claim 3, wherein the second latch comprises:

a sixth inverter receiving the output of the second transmission gate; and a second tri-state buffer receiving an output of the sixth inverter and feeding back the received output to the sixth inverter in response to the internal clock signal and the inverted clock signal.

5. A method of operating a clocked state circuit comprising:

clocking an output of a master terminal to an input of a slave terminal responsive to a clock signal or a delayed clock signal coupled to a transmission gate therebetween;

driving an output signal from an output pre-driving unit in response to an inverted clock signal and the output of the master terminal, wherein the master terminal comprises:

a first inverter receiving an external clock signal and outputting the clock signal;

a second inverter receiving the clock signal and outputting the delayed clock signal;

a first tri-state buffer receiving input data in response to the clock signal and the delayed clock signal; and a first latch latching an output of the first tri-state buffer wherein the output pre-driving unit comprises:

a first PMOS transistor having a source to which a supply voltage is applied, and a gate to which the inverted clock signal is input; and a second PMOS transistor having a source connected to a drain of the first PMOS transistor, a drain to which the output signal is input, and a gate to which the output of the master terminal is input.

6. A method according to claim 5 further comprising transmitting the output of the master terminal to the input of the slave terminal responsive to a logical OR function of a first state of the clock signal and a second state of the delayed clock signal, wherein the second state is opposite the first state.

7. A method according to claim 5 wherein transmitting comprises:

transmitting the output of the master terminal to the input of the slave terminal responsive to a first state of the clock signal; and transmitting the output of the master terminal to the input of the slave terminal responsive to a second state of the delayed clock signal, wherein the second state is opposite the first state.

8. A high-speed flip-flop comprising:

a first inverter receiving a clock signal and outputting an inverted clock signal;

a second inverter receiving the inverted clock signal and an internal clock signal;

a first tri-state buffer receiving input data in response to the internal clock signal and the inverted clock signal;

a first latch latching an output of the first tri-state buffer;

a second transmission gate transmitting an output of the first latch in response to the inverted clock signal and the internal clock signal;

a second latch latching an output of the second transmission gate;

a fifth inverter receiving the output of the second transmission gate and outputting an output signal;

a first PMOS transistor having a source to which a supply voltage is applied, and a gate to which the inverted clock signal is input; and a second PMOS transistor having a source connected to a drain of the first PMOS transistor, a drain to which the output signal is input, and a gate to which an output of the first latch is input.

9. The high-speed flip-flop of claim 8, wherein the first latch comprises:

a third inverter receiving the output of the first tri-state buffer;

a fourth inverter receiving an output of the third inverter; and a first transmission gate transmitting an output of the fourth inverter to the third inverter in response to the inverted clock signal and the internal clock signal.

10. The high-speed flip-flop of claim 8, wherein the second latch comprises:

a sixth inverter receiving the output of the second transmission gate; and a second tri-state buffer receiving an output of the sixth inverter and feeding back the received output to the sixth inverter.

* * * * *